(12) United States Patent
Ikeda et al.

(10) Patent No.: US 7,007,355 B2
(45) Date of Patent: Mar. 7, 2006

(54) METHOD OF MANUFACTURING A PIEZOELECTRIC/ELECTROSTRICTIVE DEVICE

(75) Inventors: Koji Ikeda, Hisai (JP); Kazuyoshi Shibata, Mizunami (JP); Tomoki Ito, Nagoya (JP); Fumitake Takahashi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 102 days.

(21) Appl. No.: 10/784,732

(22) Filed: Feb. 23, 2004

(65) Prior Publication Data

US 2004/0163225 A1    Aug. 26, 2004

Related U.S. Application Data

(63) Continuation of application No. PCT/JP02/09297, filed on Sep. 11, 2002.

(30) Foreign Application Priority Data

Sep. 11, 2001  (JP) .............................. 2001-275598

(51) Int. Cl.
*H04R 17/00*  (2006.01)
*H01L 41/04*  (2006.01)
*H01L 41/08*  (2006.01)
*H01L 41/18*  (2006.01)
*H02N 2/00*  (2006.01)

(52) U.S. Cl. ...................... 29/25.35; 29/25.41; 29/594; 29/830; 29/831; 310/311

(58) Field of Classification Search ............... 29/25.35, 29/25.41, 594, 830, 831; 310/311, 324, 328, 310/331

See application file for complete search history.

(56) References Cited

U.S. PATENT DOCUMENTS

| | | | | |
|---|---|---|---|---|
| 5,594,292 A | * | 1/1997 | Takeuchi et al. | ............. 310/324 |
| 5,691,594 A | * | 11/1997 | Takeuchi et al. | ............. 310/330 |
| 5,692,279 A | * | 12/1997 | Mang et al. | ................ 29/25.35 |
| 5,809,626 A | | 9/1998 | Takeuchi et al. | |
| 5,852,337 A | * | 12/1998 | Takeuchi et al. | ............. 310/328 |
| 6,455,981 B1 | | 9/2002 | Takeuchi et al. | |
| 6,534,898 B1 | | 3/2003 | Takeuchi et al. | |

FOREIGN PATENT DOCUMENTS

| | | |
|---|---|---|
| EP | 1 089 357 A2 | 4/2001 |
| EP | 1 089 359 A2 | 4/2001 |
| JP | 2001-315099 A1 | 11/2001 |
| JP | 2001-315100 A1 | 11/2001 |
| JP | 2001-320099 A1 | 11/2001 |
| JP | 2001-320103 A1 | 11/2001 |

* cited by examiner

*Primary Examiner*—A. Dexter Tugbang
*Assistant Examiner*—Tai Nguyen
(74) *Attorney, Agent, or Firm*—Burr & Brown

(57) ABSTRACT

A piezoelectric/electrostrictive device includes a pair of thin plates confronting each other, a fixing member supporting the thin plates thereon, and movable portions disposed on end portions of the pair of thin plates. Protrusions are formed on principal surfaces of first ceramic green sheets according to at least a single thick film forming process. The protrusions will subsequently serve as the movable portions, and the first ceramic green sheets will subsequently serve as the thin plates. The first ceramic green sheets and a second ceramic green sheet which will subsequently serve as the fixing member are stacked into a ceramic green laminated body. The ceramic green laminated body is baked into an integral ceramic laminated body. Piezoelectric/electrostrictive elements are formed on the ceramic laminated body. After the piezoelectric/electrostrictive elements are baked, unnecessary portions are removed from the piezoelectric/electrostrictive elements to fabricate the piezoelectric/electrostrictive device.

15 Claims, 18 Drawing Sheets

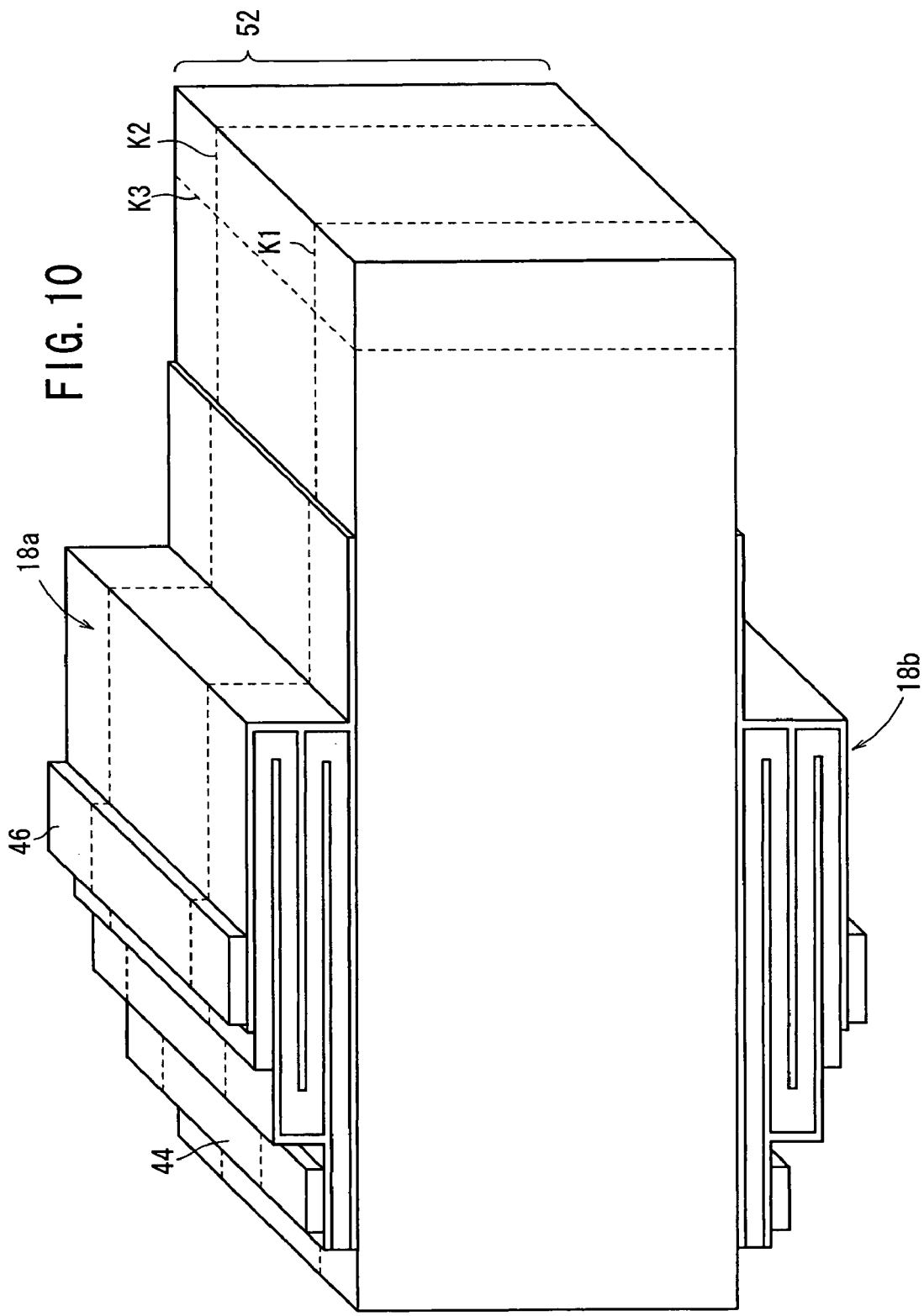

FIG. 16

| SAMPLE | PASTE VISCOTY (10,000 cps) | APPLIED PRESSURE (kPa) | PUSHED-IN DISTANCE (mm) | SQUEEZEE HARDNESS (°) | EMULSION THICKNESS (μm) | PROTRUSION FILM THICKNESS (μm) | PROTRUSION SHAPE |
|---|---|---|---|---|---|---|---|
| 1 | 10 | 100 | 0.5 | 70 | 25 | 10 | SEE FIG. 11A |
| 2 | 20 | 100 | 0.8 | 80 | 30 | 10 | SEE FIG. 15A |
| 3 | 10 | 50 | 0.5 | 70 | 30 | 15 | SEE FIG. 11A |
| 4 | 20 | 100 | 0.8 | 80 | 35 | 15 | SEE FIG. 15A |
| 5 | 10 | 50 | 0.3 | 70 | 40 | 20 | SEE FIG. 11A |
| 6 | 30 | 100 | 0.8 | 80 | 50 | 20 | SEE FIG. 15A | prior art

METHOD OF MANUFACTURING A PIEZOELECTRIC/ELECTROSTRICTIVE DEVICE

CROSS REFERENCE TO RELATED APPLICATION

This application is a continuation of International Application No. PCT/JP02/09297 having an international filing date of Sep. 11, 2002, which designated the United States, the entirety of which is incorporated herein by reference.

This application also claims the benefit of Japanese Application No. 2001-275598, filed Sep. 11, 2001, the entirety of which is incorporated herein by reference.

TECHNICAL FIELD

The present invention relates to a method of manufacturing a piezoelectric/electrostrictive device having a ceramic base including a pair of thin plates confronting each other, a fixing member supporting the thin plates thereon, and protrusions disposed on end portions of the pair of thin plates.

BACKGROUND ART

Piezoelectric/electrostrictive devices such as actuator devices, sensor devices, etc. using piezoelectric/electrostrictive layers are produced by forming an interconnection pattern comprising an electrode layer on a ceramic base as by printing, forming a piezoelectric/electrostrictive layer on the interconnection pattern by printing, thereafter baking the assembly to secure the layers, and then forming an interconnection pattern comprising another electrode layer (see, for example, Japanese laid-open patent publication No. 2001-320103,.

The piezoelectric/electrostrictive device may be used as an actuator device wherein an electric signal is supplied to the interconnection patterns to apply an electric field to the piezoelectric/electrostrictive layer for thereby displacing the piezoelectric/electrostrictive layer. The piezoelectric/electrostrictive device may also be used as a sensor device wherein an electric signal generated depending on a pressure applied to the piezoelectric/electrostrictive layer is extracted from the interconnection patterns.

The present applicant has proposed a piezoelectric/electrostrictive device which has a longer service life and an improved handling capability, allows a component to be more easily attached to its movable portion, and can be fixed in place with greater ease (see, for example, publication EP1089357A2). The proposed piezoelectric/electrostrictive device permits the movable portion to be displaced greatly with a relatively low voltage, and the device, particularly the movable portion, can be displaced at a higher speed (at a higher resonant frequency). In addition, the piezoelectric/electrostrictive device can provide a displacement device which is less susceptible to harmful vibrations, can respond at a high speed, has high mechanical strength, can be handled with ease, and has excellent shock resistance and humidity resistance, and can also provide a sensor device which is capable of detecting vibrations of the movable portion with accuracy.

As shown in FIG. 18 of the accompanying drawings, the piezoelectric/electrostrictive device 200 employs a highly flowable adhesive as an adhesive 208 used to bond thin plates 206a, 206b to a fixing member 202 and an article 204. Particularly, the thin plates 206a, 206b have protrusions 210 for defining regions where the adhesive 208 is provided. When the thin plates 206a, 206b are to be bonded to the fixing member 202 and the article 204 by the adhesive 208, the protrusions 210 define regions where the adhesive 208 is provided.

It is an object of the present invention to provide a method of manufacturing a high-performance piezoelectric/electrostrictive device having thin plates of ceramics and protrusions whose shape does not tend to affect the mechanical characteristics of the thin plates by optimizing a process of forming the protrusions and the shape of the protrusions.

DISCLOSURE OF THE INVENTION

According to the present invention, there is provided a method of manufacturing a piezoelectric/electrostrictive device including a pair of thin plates confronting each other, a fixing member supporting the thin plates thereon, and movable portions disposed on end portions of the pair of thin plates, comprising the steps of forming protrusions which will subsequently serve as the movable portions on principal surfaces of first ceramic green sheets which will subsequently serve as the thin plates, according to at least a single thick film forming process, stacking the first ceramic green sheets and a second ceramic green sheet which will subsequently serve as the fixing member, into a ceramic green laminated body, baking the ceramic green laminated body into an integral ceramic laminated body, and forming piezoelectric/electrostrictive elements on the ceramic laminated body, baking them and removing unnecessary portions therefrom to fabricate the piezoelectric/electrostrictive device.

The thick film forming process may be screen printing, electrophoresis, brush coating, transferring, dipping, etc.

Since the protrusions are formed on the principal surfaces of first ceramic green sheets which will subsequently serve as the thin plates, by the thick film forming process, the shape of the protrusions may be changed to various shapes. According to the present invention, therefore, the effect that the shape of the protrusions has on the mechanical properties of the thin plates that are made of a ceramic material is reduced.

When the piezoelectric/electrostrictive device is fabricated after unwanted portions are subsequently removed, the protrusions are constructed as the movable portions. When a component is installed between the confronting end faces (attachment surfaces) of the movable portions, the movable portions become effective, i.e., perform the function to determine the amount (thickness) and the position (bonding area) of the adhesive used to attach the component. The portion of the adhesive that is interposed between the thin plates and the component to bond the component also acts as the movable portions, and the boundaries between the adhesive and the component also function as the attachment surfaces of the movable portions.

In the above manufacturing method, the protrusions preferably have a width of 30 $\mu$m or greater. The protrusions can thus be formed by a simple screen printing process.

The protrusions preferably have a thickness in the range from 2 to 50 $\mu$m. If the thickness is too small, when the movable portions are subsequently formed, it tends to be difficult to control the adhesive when the component is installed. If the thickness of the protrusions is 50$\mu$ or greater, then the protrusions should preferably be formed by a process other than the screen printing process.

If the protrusions include a peripheral portion having a thickness H1 and a central thickest portion having a thickness H2, then the thicknesses may have a ratio H1/H2=1/3 to 3/4. Alternatively, if the protrusions include a central portion having a thickness H1 and a peripheral thickest portion having a thickness H2, then the thicknesses may have a ratio H1/H2=1/3 to 3/4. In the latter case, since a recess is defined centrally in each of the protrusions, when the movable portions are subsequently formed and the component is installed, the adhesive can reliably be retained in the recess.

In the above manufacturing method, if a material for the protrusions for making the thickness of the protrusions substantially uniform has a viscosity A in the order of 10,000 cps, then the protrusions may be made of a material having a viscosity higher than the viscosity A. With this arrangement, when the protrusions are formed by a single screen printing process, a recess can be formed centrally in each of the protrusions, thus providing the above advantages.

When the protrusions are formed on the first ceramic green sheets, a first protrusion may be formed on the first ceramic green sheets, and thereafter a second protrusion may be formed on the first protrusion in such a displaced position that the second protrusion partly overlaps the first protrusion.

With this arrangement, the thickness of the protrusions can be increased, and the gradient of portions of the protrusions that contact the first ceramic green sheets can be reduced. If the thickness of the protrusions is increased, when the movable portions are subsequently fabricated, stresses tend to concentrate on boundaries between the movable portions and the thin plates. However, since the gradient of the boundaries between the movable portions and the thin plates is small and the boundaries have an obtuse angle, stresses on the boundaries can be distributed, and any stresses concentrating on one region are reduced. The reduced stresses are highly advantageous for increasing the shock resistance of the piezoelectric/electrostrictive device.

If the first protrusion or the second protrusion has a thickness H1, and a thickest portion of an overlapping region of the first protrusion and the second protrusion has a thickness, then thicknesses have a ratio H1/H2=1/3 to 3/4. With this arrangement, the thickness of the entire protrusions can be reduced. When the movable portions are subsequently fabricated, stresses on the boundaries between the protrusions and the thin plates can be reduced.

If an overlapping region of the first protrusion and the second protrusion has a thickness H1, and a thickest portion of the first protrusion or the second protrusion has a thickness H2, then these thicknesses have a ratio H1/H2=1/3 to 3/4. With this arrangement, a recess is defined in the overlapping region of the first protrusion and the second protrusion. When the movable portions are subsequently fabricated and an article is attached between the thin plates using adhesive, the adhesive can reliably be retained in the recess, ensuring bonding strength of the article.

When the protrusions are formed on the first ceramic green sheets, a plurality of protrusions may be formed separately from each other on the first ceramic green sheets. With this arrangement, the ability to determine an amount (thickness) and a position (bonding area) of the adhesive used to install an article can further be increased.

The protrusions may be formed of a paste comprising a ceramic material which has the same composition as the first ceramic green sheets, an organic binder, and an organic solvent according to a screen printing process. When the assembly is subsequently baked into a ceramic base, the protrusions become the movable portions and the first ceramic green sheet become the thin plates. At this time, the bonding strength between the thin plates and the movable portions is increased.

A paste comprising a cermet of the above ceramic material or a ceramic material having a different composition and a metal material, an organic binder, and an organic solvent is used as the above paste. The metal material should preferably be a platinum-group metal which is highly resistant to heat because the protrusions are exposed to high temperatures when the assembly is baked into the ceramic base, and most preferably be platinum.

In the above manufacturing method, when the protrusions are formed of a paste comprising a ceramic material which has the same composition as the first ceramic green sheets, an organic binder, and an organic solvent according to a screen printing process, the protrusions preferably have a porosity of 50% or less, or more preferably have a porosity of 30% or less. If the porosity exceeds 50%, then it tends to be difficult to keep the protrusions and hence the movable portions in a constant shape, resulting in a tendency to reduce the strength of the movable portions.

In the above manufacturing method, when the protrusions are formed of a paste comprising a ceramic material which is different from the first ceramic green sheets, an organic binder, and an organic solvent according to a screen printing process, the protrusions preferably have a porosity in the range from 5 to 30%. This is because stresses generated based on the difference between the coefficients of thermal expansion of the first ceramic green sheets can be reduced.

BRIEF DESCRIPTION OF THE DRAWINGS

FIG. 10 is a view showing a state wherein the ceramic green laminated body is baked into a ceramic laminated body, after which a piezoelectric/electrostrictive device is formed;

FIG. 16 is a table showing the dependency of protrusion thicknesses and shapes upon the viscosity, etc. of pastes;

BEST MODE FOR CARRYING OUT THE INVENTION

Embodiments of a method of manufacturing a piezoelectric/electrostrictive device according to the present invention will be described below with reference to FIGS. 1 through 17B.

A piezoelectric/electrostrictive device 10 fabricated by a manufacturing method according to an embodiment of the present invention will be described below with reference to FIG. 1.

The piezoelectric/electrostrictive device 10 includes a device for converting electric energy into mechanical energy, and vice versa using a piezoelectric/electrostrictive element. Therefore, the piezoelectric/electrostrictive device 10 can be used most preferably as active devices such as various actuators, vibrators, etc., and can also preferably be used as passive devices such as acceleration sensor devices, impact sensor devices, etc.

Figure 1:
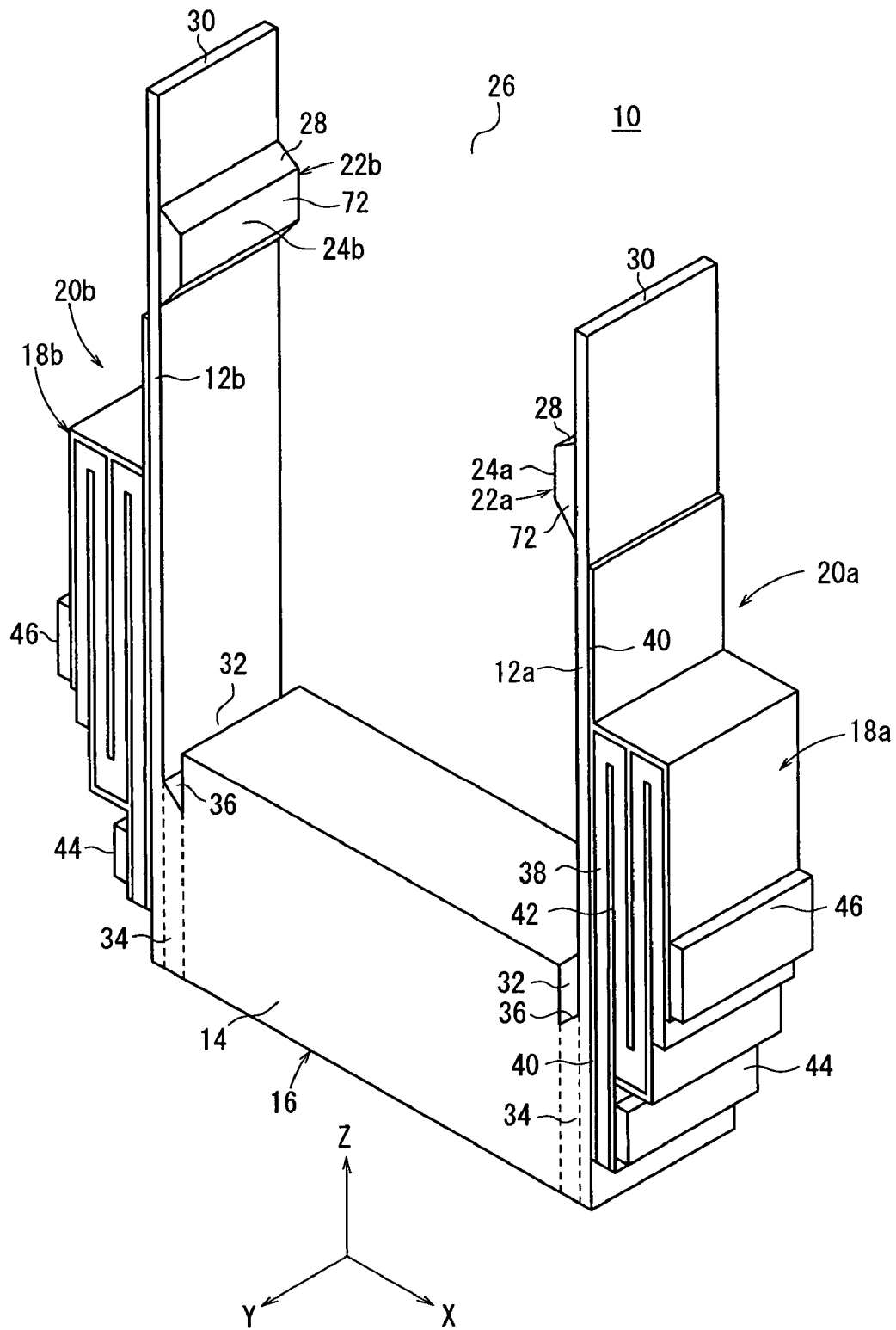
FIG. 1 is a perspective view of a piezoelectric/electrostrictive device fabricated by a manufacturing method according to an embodiment of the present invention.

As shown in FIG. 1, the piezoelectric/electrostrictive device 10 comprises a ceramic base 16 including an integral structure of a pair of thin plates 12a, 12b confronting each other and a fixing member 14 supporting the thin plates 12a, 12b thereon. Piezoelectric/electrostrictive elements 18a, 18b are formed respectively on portions of the thin plates 12a, 12b.

In the piezoelectric/electrostrictive device 10, when the piezoelectric/electrostrictive elements 18a, 18b are actuated, the thin plates 12a, 12b are displaced, or displacements of the thin plates 12a, 12b are detected by the piezoelectric/electrostrictive elements 18a, 18b. In the example shown in FIG. 1, the thin plates 12a, 12b and the piezoelectric/electrostrictive elements 18a, 18b jointly make up functional members 20a, 20b. The thin plates 12a, 12b function as vibrating members which are vibratably supported by the fixing member 14.

Protrusions 72 are disposed on the respective thin plates 12a, 12b in end portions thereof where components and members will subsequently be installed. The protrusions 72 and regions including an adhesive 76 (see FIG. 11B) for installing components and members function as movable portions 22a, 22b that are displaced when the thin plates 12a, 12b are displaced. The regions (including the protrusions 72 and the installing adhesive) where components and members will subsequently be installed on the end portions of the thin plates 12a, 12b will hereinafter be referred to as the movable portions 22a, 22b.

The movable portions 22a, 22b have respective end faces 24a, 24b confronting each other. A gap (air) 26 may be interposed between the end faces 24a, 24b or a plurality of members, not shown, made of a material which may be the same as or different from the material of the movable portions 22a, 22b may be interposed between the end faces 24a, 24b. The confronting end faces 24a, 24b of the movable portions 22a, 22b also function as attachment surfaces 24a, 24b. Therefore, the end faces 24a, 24b may also be referred to as attachment surfaces 24a, 24b.

The protrusions 72 have distal end faces 28 positioned more closely to the fixing member 14 than tip end faces 30 of the thin plates 12a, 12b. When a component is installed between the attachment surfaces 24a, 24b, the protrusions 72 function to determine an amount (thickness) and a position (bonding area) of the adhesive used to install the component. The adhesive 76 (see FIG. 11B) interposed between the thin plates 12a, 12b and the component for bonding the component also acts as a movable portion, and the boundary surfaces between the adhesive 76 and the component function as the attachment surfaces 24a, 24b of the movable portions 22a, 22b.

The ceramic base 16 comprises an integral ceramic laminated body produced by baking a ceramic green laminated body, for example, as described later on.

Notches (recesses) 32 are defined between the fixing member 14 and the thin plates 12a, 12b. The notches 32 are formed by laminating a plurality of ceramic plates (the thin plates 12a, 12b and shorter ceramic plates 34) having different processed shapes, or laminating three types of ceramics plates (the thin plates 12a, 12b, shorter ceramic plates 34, and the fixing member 14) having different processed shapes with the shorter ceramic plates 34 sandwiched centrally. The ceramic plates before they are laminated have such thicknesses that each of the thin plates 12a, 12b and the shorter ceramic plates 34 has a thickness in the range from 5 to 200 $\mu$m and the fixing member 14 has a thickness in the range from 50 to 500 $\mu$m. It is difficult to handle ceramic plates having a thickness smaller than 5 $\mu$m, and it is difficult to form ceramic plates having a thickness greater than 500 $\mu$m.

Corners 36 defined by inner wall surfaces of the thin plates 12a, 12b and side surfaces (notched surfaces) of the shorter ceramic plates 34 are of a substantially tapered shape.

The integral ceramic assembly thus produced has highly reliable joints and has a structure that is advantageous for maintaining rigidity because the assembly is essentially free of time-dependent changes as no adhesive being present in the joints. The integral ceramic assembly can also be manufactured easily by a ceramic green sheet laminating process to be described later on.

The piezoelectric/electrostrictive elements 18a, 18b are formed directly on the ceramic base 16 by preparing the piezoelectric/electrostrictive elements 18a, 18b as separate members and performing a film forming process on the ceramic base 16, described later on.

Each of the piezoelectric/electrostrictive elements 18a, 18b comprises a piezoelectric/electrostrictive layer 38 and a pair of electrodes 40, 42 formed on respective opposite sides of the piezoelectric/electrostrictive layer 38. Of the electrodes 40, 42, the electrode 40 is formed on at least the thin plates 12a, 12b.

According to the present embodiment, each of the piezoelectric/electrostrictive layer 38 and the electrodes 40, 42 has a multilayer structure. Specifically, the electrode 40 and the other electrode 42 are provided in alternate layers having a comb-toothed cross section, and these layers are superposed with the layers of the piezoelectric/electrostrictive layer 38 sandwiched therebetween, providing the piezoelectric/electrostrictive elements 18a, 18b in a multi-stage arrangement. However, a single-layer structure may be employed rather than such a multilayer structure.

Various components of the piezoelectric/electrostrictive device 10 will be described below.

As described above, the movable portions 22a, 22b are portions that operate based on actuating forces from the thin plates 12a, 12b, and various members are mounted on the movable portions 22a, 22b depending on the purpose for which the piezoelectric/electrostrictive device 10 is used.

For example, if the piezoelectric/electrostrictive device 10 is used as a displacement device, a shield plate of an optical shutter or the like is mounted on the movable portions 22a, 22b. If the piezoelectric/electrostrictive device 10 is used as a mechanism for positioning a magnetic head of a hard disk drive or a mechanism for suppressing the ringing of such a magnetic head, then the magnetic head, a slider having the magnetic head, or a suspension having a slider, or the like which needs to be positioned is mounted on the movable portions 22a, 22b.

The fixing member 14 is a member which supports the thin plates 12a, 12b and the movable portions 22a, 22b. If the piezoelectric/electrostrictive device 10 is used to position a magnetic head of a hard disk drive, for example, then the fixing member 14 is supported on and fixed to a carriage arm attached to a VCM (Voice Coil Motor) or a fixed plate or suspension attached to the carriage arm, thus securing the piezoelectric/electrostrictive device 10 in its entirety. As shown in FIG. 1, connection terminals 44, 46 for energizing the piezoelectric/electrostrictive elements 18a, 18b or other members may be mounted on the fixing member 14.

The movable portions 22a, 22b and the fixing member 14 are not limited to any materials insofar as they are rigid. Preferably, the movable portions 22a, 22b and the fixing member 14 are made of ceramics to which the above ceramic green sheet laminating process is applicable.

Specifically, materials chiefly composed of zirconia including stabilized zirconia and partially stabilized zirconia, alumina, magnesia, silicon nitride, aluminum nitride, and titanium oxide, and materials chiefly composed of mixtures of the above constituents. Particularly preferable are materials chiefly composed of zirconia, especially stabilized zirconia and partially stabilized zirconia, for their increased mechanical strength and toughness.

The thin plates 12a, 12b are portions that are actuated when the piezoelectric/electrostrictive elements 18a, 18b are displaced. The thin plates 12a, 12b are flexible thin plates, and have a function to amplify an extended or contracted displacement of the piezoelectric/electrostrictive elements 18a, 18b disposed on their surfaces as a flexural displacement, and transmit the flexural displacement to the movable portions 22a, 22b. Therefore, the thin plates 12a, 12b may be of such shapes and materials that make them flexible and have a mechanical strength large enough for them not to be broken by a flexural displacement produced thereby. Materials of the thin plates 12a, 12b may be selected in view of the responsiveness and operability of the movable portions 22a, 22b.

The protrusions 72 should preferably be made of ceramics similar to those of the thin plates 12a, 12b and the fixing member 14. Particularly preferable are materials chiefly composed of zirconia, especially stabilized zirconia and partially stabilized zirconia, because they have large mechanical strength and toughness even if they are in the form of thin plates, and also because their reactivity with the piezoelectric/electrostrictive layer and electrode materials is small.

The stabilized zirconia and partially stabilized zirconia should preferably be stabilized and partially stabilized as follows: Compounds used to stabilize or partially stabilize zirconia include yttrium oxide, ytterbium oxide, cerium oxide, calcium oxide, and magnesium oxide. Zirconia can be stabilized by adding and containing one of these compounds or adding a combination of these compounds to zirconia. Though certain oxides have been described above as a stabilizer, zirconia can also be stabilized by adding a compound that contains any of elements which will become the above oxides when heated.

The above compounds may be added in such proportions as 1 through 30 mol %, preferably 1.5 through 10 mol %, for yttrium oxide and ytterbium oxide, 6 through 50 mol %, preferably 8 through 20 mol %, for cerium oxide, 5 through 40 mol %, preferably 5 through 20 mol %, for calcium oxide and magnesium oxide. In particular, it is preferable to use yttrium oxide as a stabilizer. If yttrium oxide is used as a stabilizer, then it is preferable to add 1.5 through 10 mol % of yttrium oxide, more preferably 2 through 4 mol % for increased mechanical strength or 5 through 7 mol % for increased reliable durability. Alumina, silica, or a transition metal oxide may be added as an additive such as a sintering agent in a proportional range from 0.05 to 20 wt %. If the piezoelectric/electrostrictive elements 18a, 18b are formed according to an integral sintering film forming process, then it is preferable to add alumina, magnesia, or a transition metal oxide as an additive.

In order to achieve a desired mechanical strength and stable crystalline phase, the average grain size of zirconia should preferably range from 0.05 to 3 μm, more preferably from 0.05 to 1 μm. While the thin plates 12a, 12b may be made of ceramics similar to those of the movable portions 22a, 22b and the fixing member 14, the thin plates 12a, 12b should preferably be made of a material substantially identical to that of the movable portions 22a, 22b and the fixing member 14 for thereby achieving the reliability of the joints and the mechanical strength of the piezoelectric/electrostrictive device 10, and reducing complexities of the manufacturing process.

The piezoelectric/electrostrictive elements 18a, 18b have at least the piezoelectric/electrostrictive layer 38 and the pair of electrodes 40, 42 for applying an electric field to the piezoelectric/electrostrictive layer 38, and may be in the form of unimorph or bimorph piezoelectric/electrostrictive elements. Unimorph piezoelectric/electrostrictive elements combined with the thin plates 12a, 12b are suitable for use in the piezoelectric/electrostrictive device 10 as they are better for excellent stability of produced displacements and a reduction in the weight of the piezoelectric/electrostrictive device 10.

As shown in FIG. 1, the piezoelectric/electrostrictive elements 18a, 18b are formed to displace the thin plates 12a, 12b in the direction of thickness, and preferable as they can actuate the thin plates 12a, 12b largely.

The piezoelectric/electrostrictive layer 38 is preferably made of piezoelectric ceramics. However, they may be made of electrostrictive ceramics, ferroelectric ceramics, or antiferroelectric ceramics. If the piezoelectric/electrostrictive device 10 is used to position a magnetic head of a hard disk drive, then since the linearity of the relationship between the displacement of the movable portions 22a, 22b and the drive voltage or output voltage is important, the piezoelectric/electrostrictive layer 38 is preferably made of a material having a small strain history, and preferably made of a material having a coercive electric field of 10 kV/mm or less.

Specific piezoelectric materials include lead. zirconate, lead titanate, lead magnesium niobate, lead nickel niobate, lead zinc niobate, lead manganese niobate, lead antimony tinate, lead manganese tungstenate, lead cobalt niobate, barium titanate, sodium titanate bismuth, potassium niobate sodium, and strontium tantalate bismuth, either singly or in a mixture thereof.

Particularly, materials chiefly composed of lead zirconate, lead titanate, and lead magnesium niobate, or a material chiefly composed of sodium titanate bismuth is preferably used because they have a high electromechanical coupling constant and a high piezoelectric constant, small reactivity with the thin plates (ceramics) 12a, 12b when the piezoelectric/electrostrictive layer 38 is baked, and provide a stable composition.

To these piezoelectric materials, there may be added lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, etc., either singly or in a mixture thereof.

For example, if lanthanum or strontium is added to lead zirconate, lead titanate, and lead magnesium niobate which are principal compounds, then it is possible to adjust the coercive electric field and the piezoelectric properties.

Materials which can easily be vitrified, such as silica, etc. should desirably be of 2 weight % or less with respect to the piezoelectric/electrostrictive material. If added in 2 weight % or more, materials serving as a sintering agent such as silica would easily react to the piezoelectric/electrostrictive material when the piezoelectric/electrostrictive layer 38 is heated, changing its composition, and degrading its piezoelectric properties. However, silica added in a suitable amount is effective to improve the sinterability of the piezoelectric/electrostrictive material.

The electrodes 40, 42 of the piezoelectric/electrostrictive elements 18a, 18b are preferably made of a metal which is solid at room temperature and highly electrically conductive. For example, the electrodes 40, 42 are made of a metal such as aluminum, titanium, chromium, iron, cobalt, nickel, copper, zinc, niobium, molybdenum, ruthenium, palladium, rhodium, silver, tin, tantalum, tungsten, iridium, platinum, gold, lead, or the like, or an alloy of some of these metals. Alternatively, the electrodes 40, 42 may be made of a cermet containing one of the above metals or an alloy of some of these metals, and ceramics of the same composition as the piezoelectric/electrostrictive layer 38 or the thin plates 12a, 12b or materials different from those ceramics, dispersed in the metal or alloy. The ceramics used in the cermet are preferable because they increase the bonding strength if provided in the same composition as the ceramics held in contact with the electrodes 40, 42, and are more preferably be provided in a plurality of layers. Ceramics having different compositions from those ceramics may also be used if they can attain the above bonding strength. The composition of the cermet is in the range of 90/10 to 10/90 in terms of metal volume/ ceramic volume where the volume is calculated as the weight of each material/the true density of each material. More preferably, the composition of the cermet is in the range of 30/70 to 70/30 for developing the mechanical strength of the metal and the bonding power of the ceramics with respect to the thin plate base.

The material of the electrodes 40, 42 is selected depending on the process for forming the piezoelectric/electrostrictive layer 38. For example, if the electrode 40 is formed on the thin plates 12a, 12b and thereafter the piezoelectric/electrostrictive layer 38 is formed on the elect-rode 40 by baking, then it is necessary to make the electrode 40 of a high-melting-point metal material such as platinum, palladium, a platinum-palladium alloy, a silver-palladium alloy, or the like which does not change at the baking temperature of the piezoelectric/electrostrictive layer 38. After the piezoelectric/electrostrictive layer 38 is formed, the electrode as the outermost layer can be formed at a low temperature on the piezoelectric/electrostrictive layer 38. Therefore, the electrode may be made of a low-melting-point such as aluminum, gold, silver, or the like as a chief component.

The thickness of the electrodes 40, 42 is responsible for substantially reducing displacements of the piezoelectric/electrostrictive elements 18a, 18b. Therefore, an electrode to be formed after the piezoelectric/electrostrictive layer 38 is baked should preferably be made of an organometallic paste which can be turned into a dense thin film after being baked, such as a gold resinate paste, a platinum resinate paste, a silver resinate paste, or the like. The thickness of the electrodes 40, 42 thus formed may be 1 $\mu$m or less.

The piezoelectric/electrostrictive device 10 can preferably be used as various sensors including an ultrasonic sensor, an acceleration sensor, an angular velocity sensor, an impact sensor, a mass sensor, etc. The sensitivity of the sensor can easily be adjusted by adjusting the size of an object attached between the end faces 24a, 24b or the thin plates 12a, 12b.

The piezoelectric/electrostrictive elements 18a, 18b may be formed on the surface of the thin plates 12a, 12b by, other than the screen printing process described above, a thick film forming process such as dipping, coating, or electrophoresis, or a thin film forming process such as ion beam, sputtering, vacuum evaporation, ion plating, chemical vapor deposition (CVD), plating, etc.

By forming the piezoelectric/electrostrictive elements 18a, 18b according to such a film forming process, the piezoelectric/electrostrictive elements 18a, 18b and the thin plates 12a, 12b can integrally be joined to each other without any adhesive, are made reliable and reproducible, and can easily be integrated.

It is preferable to form piezoelectric/electrostrictive elements 18a, 18b according to a thick film forming process. If the piezoelectric/electrostrictive layer 38 is formed according to a thick film forming process, then it can be formed as a film using a paste, a slurry, or a suspension, an emulsion, or a sol which is mainly composed of particles or powder of piezoelectric ceramics having an average particle diameter ranging from 0.01 to 5 μm, preferably from 0.05 to 3 μm, and good piezoelectric/electrostrictive properties can be achieved by baking the film thus formed.

The electrophoresis process is advantageous in that it can form films at a high density with a high shape accuracy. The screen printing process is effective to simplify the manufacturing process as it allows films and patterns to be formed at the same time.

Some specific examples of the method of manufacturing the piezoelectric/electrostrictive device according to the embodiment of the present invention will be described below with reference to FIGS. 2 through 17B.

First, some definitions will be made with respect to the manufacturing process. A laminated body of ceramic green sheets is defined as a ceramic green laminated body 50 (see FIG. 9, for example). A unitary laminated body produced when the ceramic green laminated body 50 is baked is defined as a laminated ceramic body 52 (see FIG. 10, for example). A unitary structure produced when unnecessary portions are removed from the laminated ceramic body 52 and including the thin plates 12a, 12b, the movable portions 22a, 22b, and the fixing member 14 is defined as the ceramic base 16 (see FIG. 1).

In the method of manufacturing the piezoelectric/electrostrictive device 10 according to the embodiment of the present invention, a ceramic laminated body 82 which contains portions corresponding to piezoelectric/electrostrictive devices 10 arranged in vertical and horizontal arrays is cut off into chips serving as piezoelectric/electrostrictive devices 10. For the ease of illustration, it is assumed that only one piezoelectric/electrostrictive device 10 is fabricated.

Figure 2:
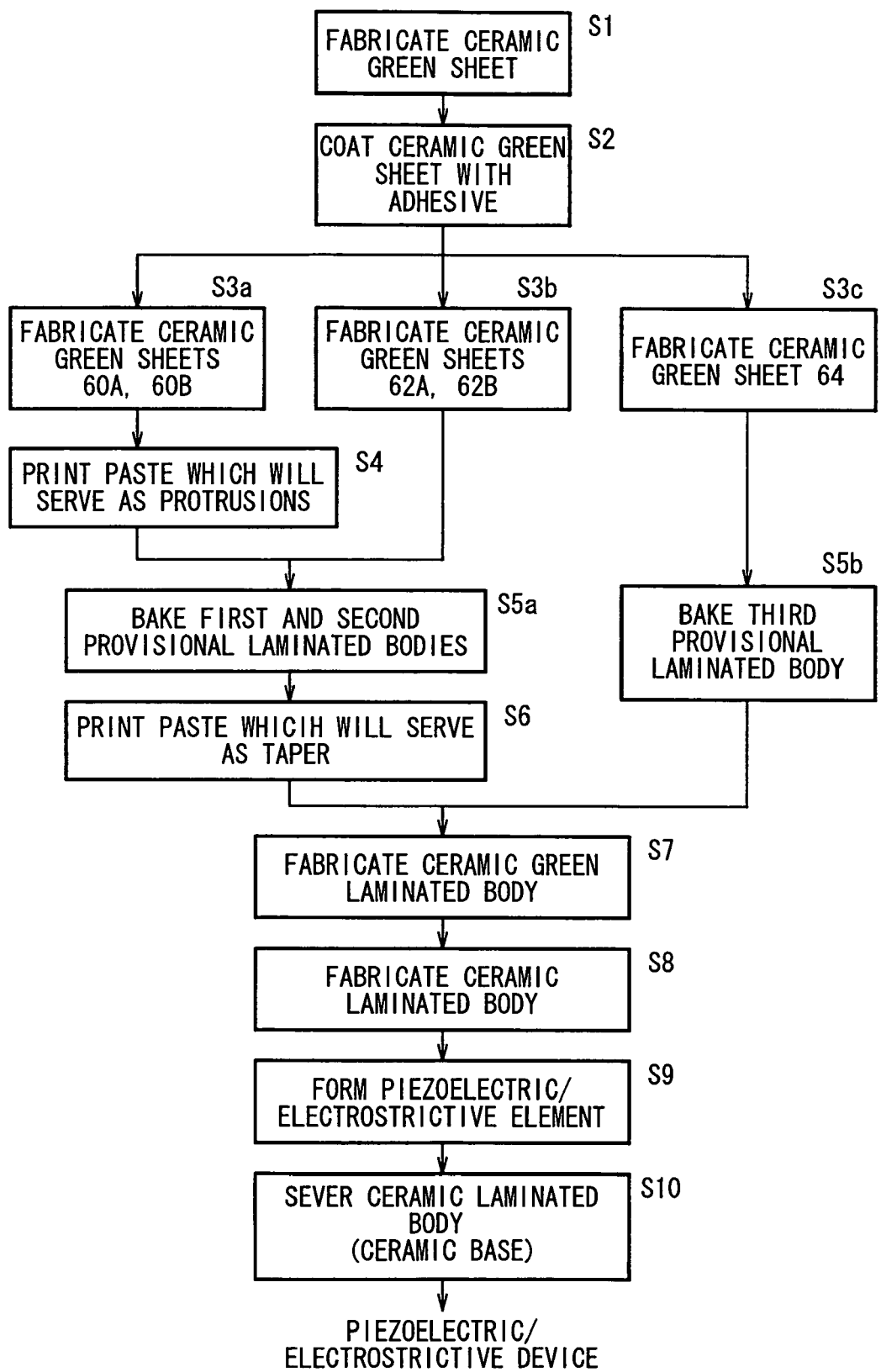
FIG. 2 is a process block diagram showing the manufacturing method according to the embodiment of the present invention.

In step S1 shown in FIG. 2, a binder, a solvent, a disperser, a plasticizer, etc., are added to a ceramic power of zirconia or the like, and they are mixed into a slurry. After the slurry is deaerated, it is processed into a ceramic green sheet having a given thickness by a reverse roll coater process, a doctor blade process, or the like.

Then, in step S2 shown in FIG. 2, predetermined regions of each of ceramic green sheets are coated with an adhesive (e.g., a ceramic paste) by a screen printing process.

Figure 3:
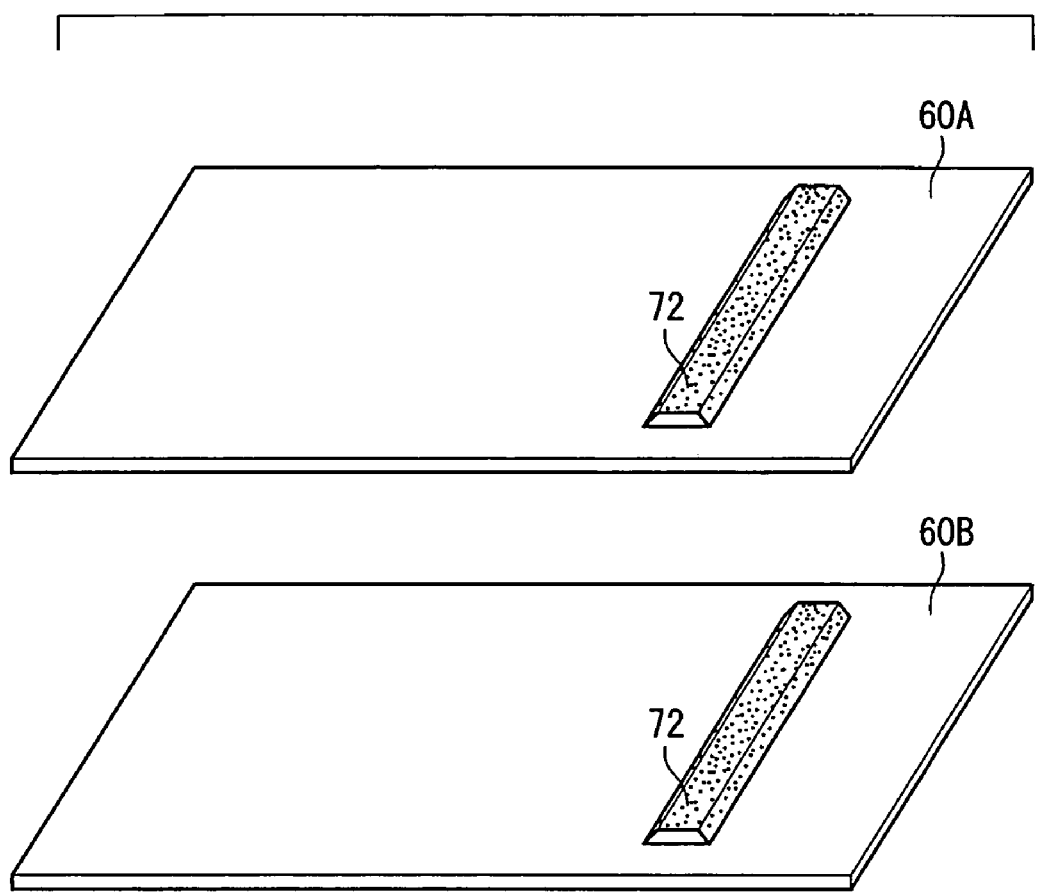
FIG. 3 is a perspective view showing a state wherein a paste that is to serve a protrusion is formed on each of principal surfaces of ceramic green sheets which will subsequently become thin plates.

Then, in steps S3a, S3b, and S3c shown in FIG. 2, the ceramic green sheets are processed by a blanking process using dies, a laser beam cutting process, or the like. In step S3a, the ceramic green sheets are processed into ceramic green sheets 60A, 60B which will subsequently serve as thin plates 12a, 12b, as shown in FIG. 3. Thereafter, in step S4, protrusions 72 which will subsequently serve as part of the movable portions 22a, 22b are formed on respective principal surfaces of the ceramic green sheets 60A, 60B. The protrusions 72 are formed by applying a paste according to a screen printing process.

Figure 11A:
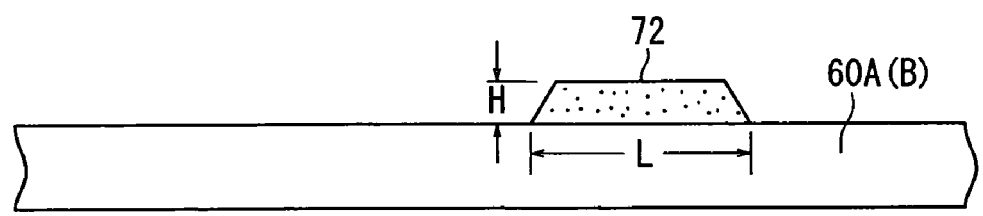
FIG. 11A is a view showing a state wherein a protrusion is formed by printing a paste on a principal surface of a ceramic green sheet by a manufacturing method according to a first specific example.

According to the first specific example, as shown in FIG. 11A, each of the protrusions 72 has a width L of 30 μm or more and a thickness H n the range from 2 to 50 μm. Therefore, the protrusions 72 can be formed according to a simple screen printing process.

Figure 4:
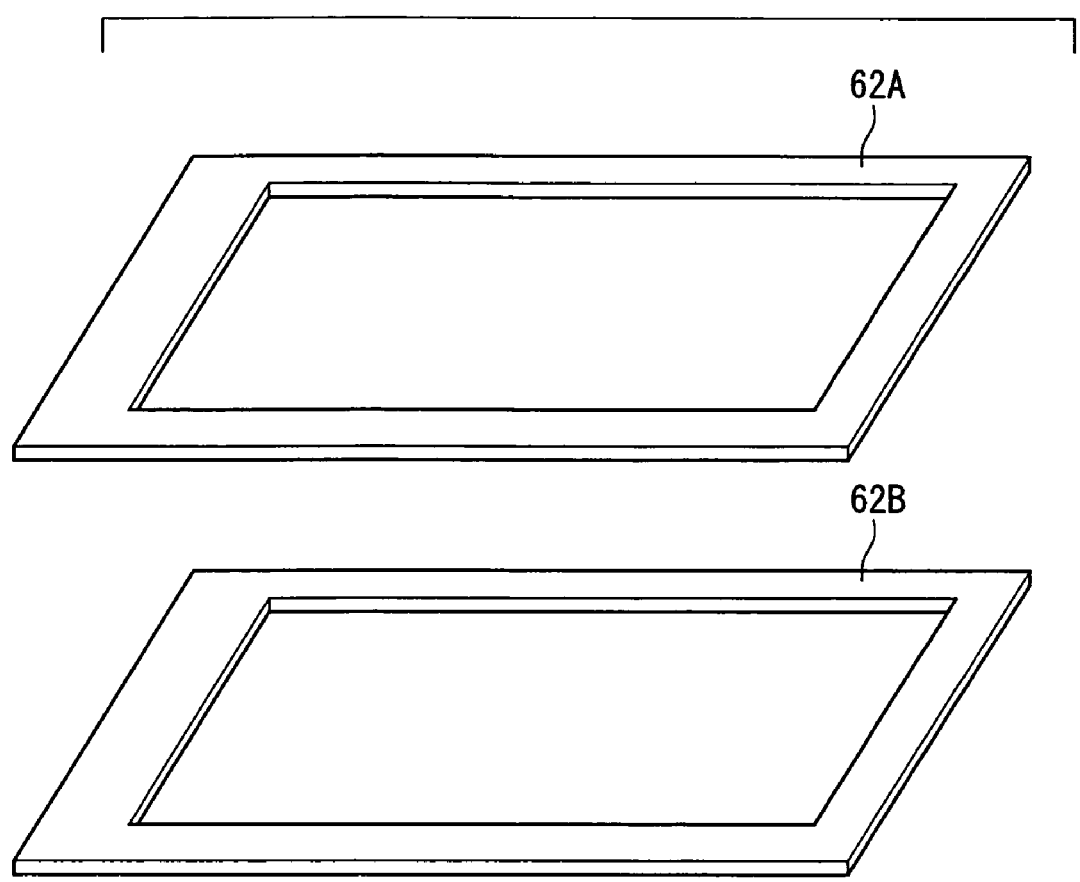
FIG. 4 is a perspective view of ceramic green sheets which will subsequently become short ceramic plates.
Figure 5:
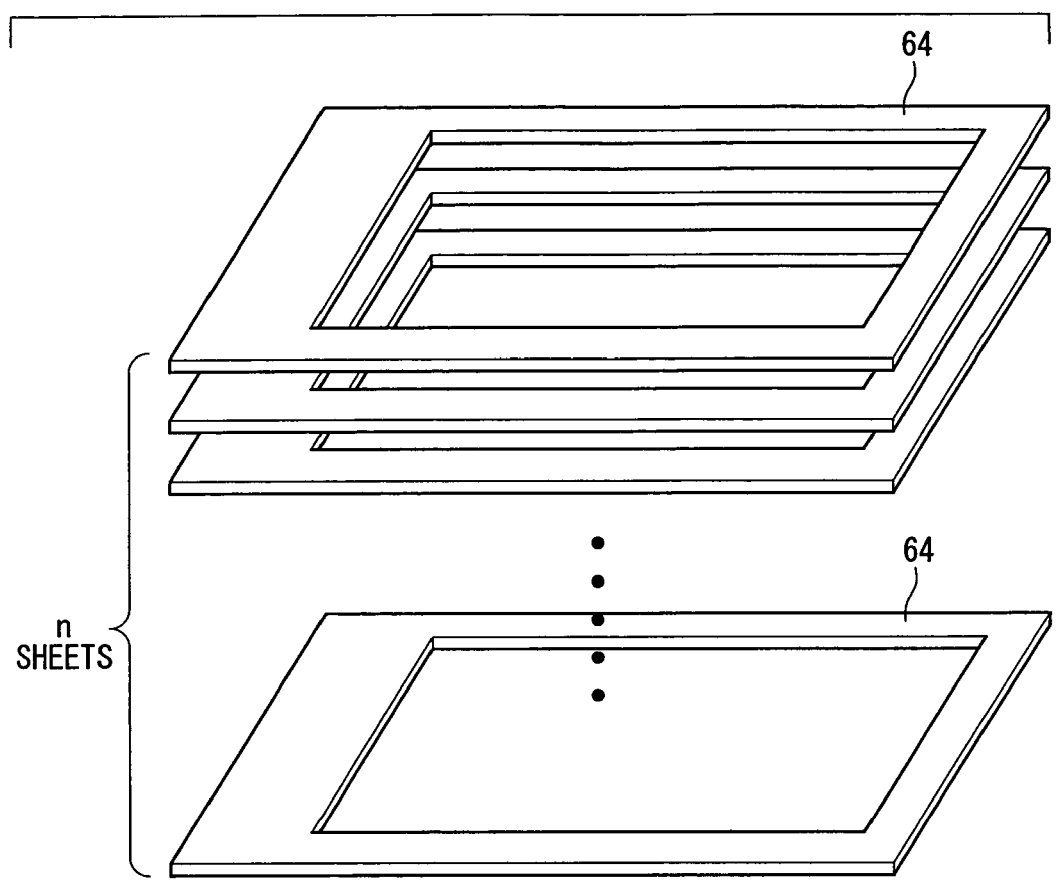
FIG. 5 is a perspective view of ceramic green sheets which will subsequently become a fixing member.

In step S3b shown in FIG. 2, the ceramic green sheets are processed into ceramic green sheets 62A, 62B which will subsequently serve as shorter ceramic plates 34, as shown in FIG. 4. In step S3c shown in FIG. 2, the ceramic green sheets are processed into n ceramic green sheets 64 which will subsequently serve as a fixing member 14, as shown in FIG. 5.

Figure 6:
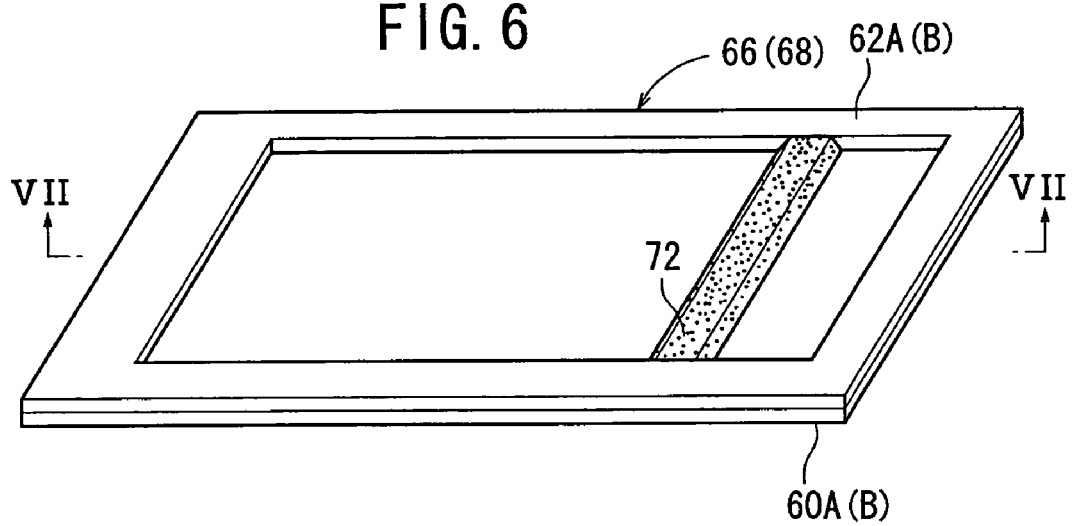
FIG. 6 is a perspective view of first and second provisional laminated bodies.
Figure 7:
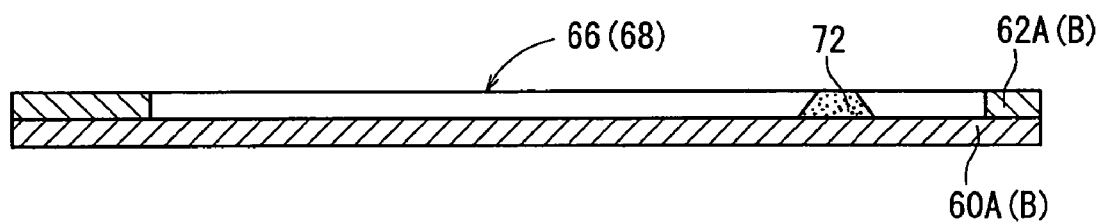
FIG. 7 is a cross-sectional view taken along line VII—VII of FIG. 6.
Figure 8:
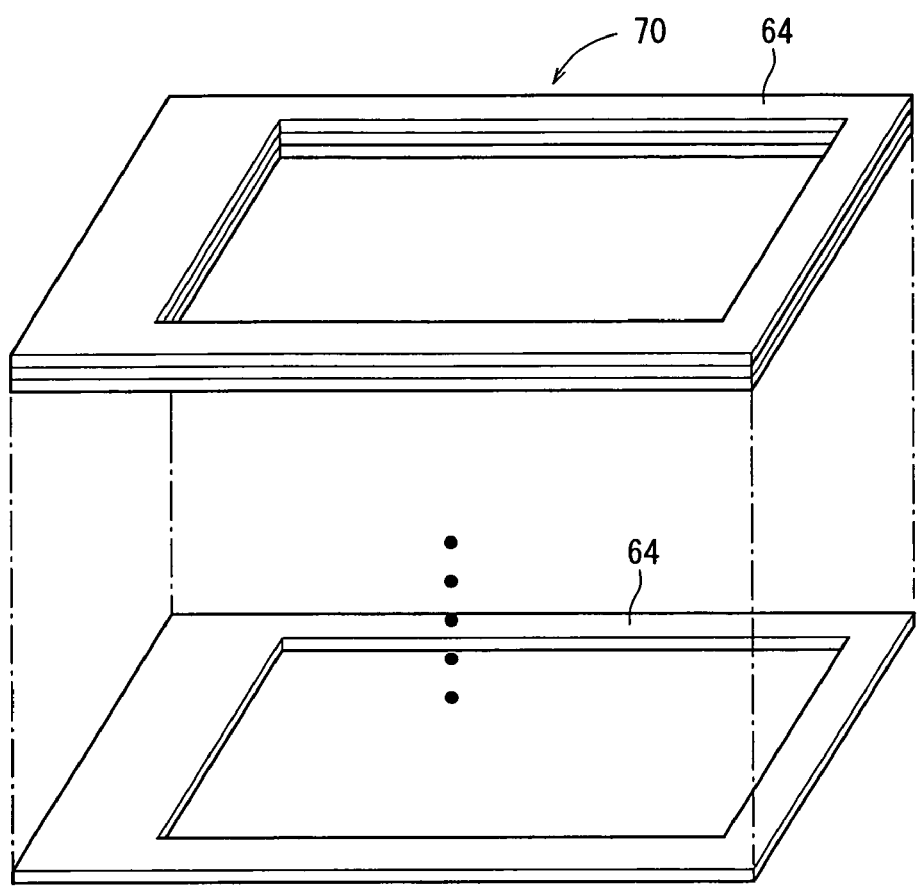
FIG. 8 is a perspective view of a third provisional laminated body.

Thereafter, in step S5a shown in FIG. 2, the ceramic green sheet 60A and the ceramic green sheet 62A are provisionally stacked one on the other to produce a first provisional laminated body 66 (see FIGS. 6 and 7), and the ceramic green sheet 60B and the ceramic green sheet 62B are provisionally stacked one on the other to produce a second provisional laminated body 68 (see FIGS. 6 and 7). In step S5b, the n ceramic green sheets 64 are provisionally stacked into a third provisional laminated body 70 (see FIG. 8). Since the ceramic green sheets 60A, 60B, 62A, 62B and the n ceramic green sheets 64 have been coated with the adhesive in certain regions according to the screen printing process, the laminated structure is prevented from collapsing.

Figure 9:
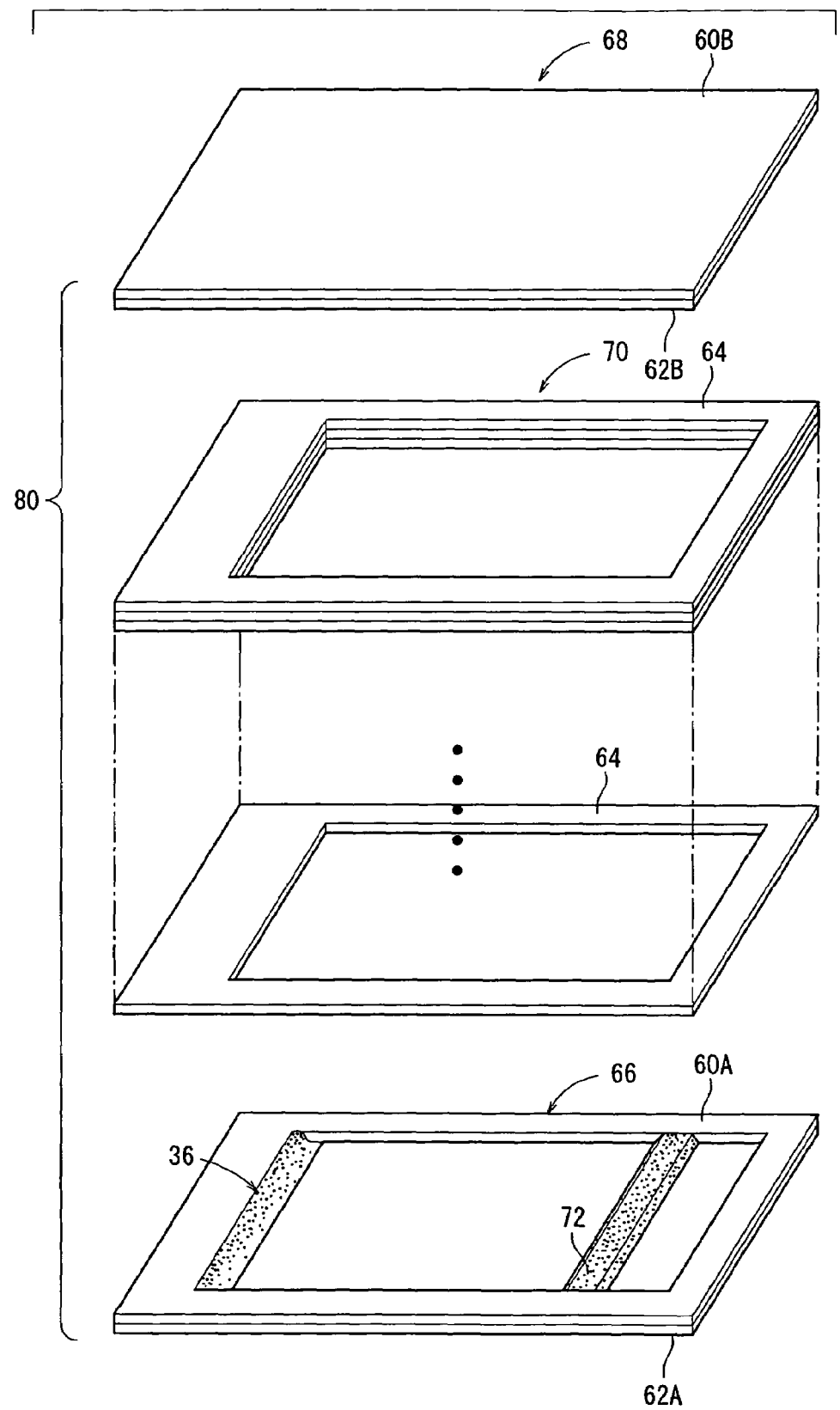
FIG. 9 is a perspective view showing the manner in which the first through third provisional laminated bodies are stacked into a ceramic green laminated body.

Thereafter, in step S6 shown in FIG. 2, the first provisional laminated body 66 is coated with a paste according to the screen printing process in order to give a tapered shape to a corner 36 which is defined by a principal surface of the ceramic green sheet 60A and a side surface of the ceramic green sheet 62A, as shown in FIG. 9.

Basically, the paste for forming tapers on the protrusions 72 and the corners 36 should preferably be of the same as the same material and composition as the thin plates 12a, 12b. For example, the paste comprises a mixture of a ceramic powder, a binder, an additive, and a solvent. For example, the ceramic powder comprises $ZrO_2$ and $Y_2O_3$ added thereto in the range referred to above. The binder comprises PVB, acrylic resin, ethyl cellulose, or a mixture thereof, and 5 to 40 parts of the binder are added to 100 parts of the ceramic powder. 2 to 20 parts of the plasticizer such as DOP or the like and, if necessary, an additive as the disperser are added to the ceramic powder, and 2-ethyl hexanol, butyl carbitol, or the like is added as the solvent in a suitable quantity. When the paste is prepared, a low-melting-point solvent such as IPA or the like should preferably be used as a mixing additive to mix the above materials well. If the above cermet is used, then a paste comprising a mixture of a ceramic material, a metal material, a binder, an additive, and a solvent is used. For preparing the cermet paste, a ceramic paste and a metal paste may separately be produced, and then mixed with each other to provide a predetermined composition.

The paste should desirably have such a viscosity that it can smoothly be applied through a window in a plate used in the screen printing process to the corners 36 and the principal surface of the ceramic green sheet 60A, and, after being printed, it can appropriately sag before being dried. If the viscosity is too high, the paste may not take a desired shape but may be solidified after being applied. If the viscosity is too low, it may not achieve a predetermined thickness when applied in a predetermined number of times, and may not take a desired shape. In particular, when the corners 36 are tapered, it is necessary to consider the thickness and the viscosity of the shorter ceramic plates 34 (see FIG. 1). In this specific example, the viscosity of the paste is in the range from 1 to 500 thousand cps.

Similarly, the second provisional laminated body 68 is coated with a paste according to the screen printing process in order to give a tapered shape to a corner 36 which is defined by a principal surface of the ceramic green sheet 60B and a side surface of the ceramic green sheet 62B.

According to the above example, in step S4 before the first and second laminated bodies 66, 68 are fabricated, a paste is printed on the principal surfaces of the ceramic green sheets 60A, 60B to form the protrusions 72. Alternatively, the protrusions 72 may be formed after the first and second laminated bodies 66, 68 are fabricated.

Thereafter, in step S7 shown in FIG. 2, as shown in FIG. 9, the first through third provisional laminated bodies 66, 68, 70 are stacked such that the third provisional laminated body 70 is sandwiched between the first and second provisional laminated bodies 66, 68. Thereafter, the first through third provisional laminated bodies 66, 68, 70 are pressed into the ceramic green laminated body 50. At this time, the paste may be squeezed out onto the ceramic green sheets 62A, 62B. However, since the squeezed paste is embedded when the third provisional laminated body 70 is stacked, no consideration needs to be given to the squeezed paste. In FIG. 6, the length of the protrusion 72 is substantially the same as the width of the window in the ceramic green sheet 66. However, the length of the protrusion 72 may be smaller or larger than the width of the window in the ceramic green sheet 66.

In the above example, since the corners are tapered, the first and second provisional laminated bodies need to be fabricated as shown in FIG. 6. However, if the corners 36 are not tapered, then there is no need to fabricate the first and second provisional laminated bodies. At any rate, if the notches 32 are provided, the third provisional laminated body needs to be fabricated in step S5b shown in FIG. 2.

Because of the need to stack ceramic green sheets for forming the notches, if all the ceramic green sheets are stacked under pressure all at once, rather than being provisionally stacked, then the ceramic green sheets may not sufficiently be stacked in regions corresponding to the notches. If all the ceramic green sheets are stacked under pressure all at once, then it is necessary to employ a process capable of transmitting the pressure to regions where the notches are to be formed and incorporating those materials which will be eliminated after being baked.

Thereafter, in step S8 shown in FIG. 2, the ceramic green laminated body 50 is baked into the ceramic laminated body 52 (see FIG. 10).

Then, in step S9 shown in FIG. 2, the piezoelectric/electrostrictive elements 18a, 18b, each of a multilayer structure, are formed respectively on the opposite surfaces of the ceramic laminated assembly 52, i.e., the surfaces where the ceramic green sheets 60A, 60B are positioned. The assembly is then baked to integrally combine the piezoelectric/electrostrictive elements 18a, 18b with the ceramic laminated assembly 52. The piezoelectric/electrostrictive element 18a or 18b may be formed on only one surface of the ceramic laminated assembly 52.

Thereafter, in step S10 shown in FIG. 2, as shown in FIG. 10, the ceramic laminated body 52 with the piezoelectric/electrostrictive elements 18a, 18b disposed thereon is cut along cutting lines K1, K2, K3, thus removing sides and a tip end of the ceramic laminated body 52. As a result, as shown in FIG. 1, the piezoelectric/electrostrictive device 10 having the piezoelectric/electrostrictive elements 18a, 18b on the ceramic base 16 and the protrusions 72 formed on the confronting inner wall surfaces of the thin plates 12a, 12b is produced.

The ceramic laminated body 52 may be cut by a cutting process using a bonded abrasive such as a dicer, a slicer, or the like, or a cutting process using a loose abrasive such as a wire saw or the like. A cutting process using a loose abrasive is preferable for cutting the piezoelectric/electrostrictive elements 18a, 18b.

The ceramic laminated body 52 may be severed first along the cutting lines K1, K2 and then along the cutting line K3, or first along the cutting line K3 and then along the cutting lines K1, K2. Alternatively, the ceramic laminated body 52 may be severed simultaneously along the cutting lines K1, K2, K3. The end face of the fixing member 14 which faces the cutting line K3 may also be cut off. Thereafter, the piezoelectric/electrostrictive device 10 is ultrasonically cleaned to remove debris which may have been produced in the cutting process.

In the manufacturing method according to the first specific example, as described above, inasmuch as the protrusions 72 are formed on the principal surfaces of the ceramic green sheets 60A, 60B which will subsequently serve as the thin plates 12a, 12b, by the thick film forming process, it is possible to change the protrusions 72 to various shapes. Therefore, the effect that the shape of the protrusions 72 has on the mechanical properties of the thin plates 12a, 12b that are made of a ceramic material is reduced.

Figure 11B:
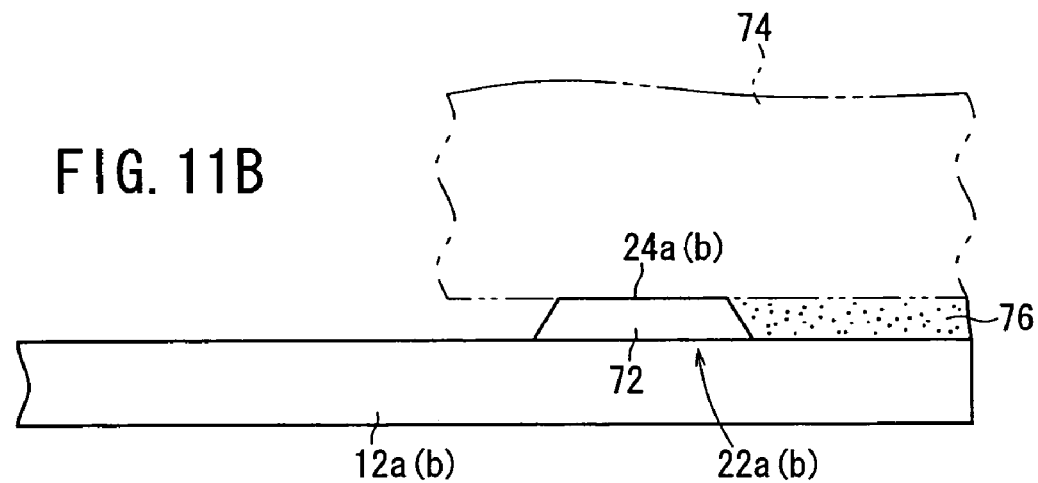
FIG. 11B is a view showing a state wherein a component is mounted on a movable portion after a piezoelectric/electrostrictive device is formed.

When the piezoelectric/electrostrictive device 10 is fabricated after unwanted portions are subsequently removed, as shown in FIG. 11B, the protrusions 72 and the adhesive 76 jointly make up the movable portions 22a, 22b. When a component 74 (indicated by the two-dot-and-dash lines) is installed between the confronting end faces (the attachment surfaces 24a, 24b) of the movable portions 22a, 22b, the protrusions 72 become effective, i.e., sufficiently perform the function to determine the amount (thickness) and the position (bonding area) of the adhesive 76 used to attach the component 74.

According to the first specific example, the protrusions 72 are formed by the screen printing process from a paste which comprises a ceramic material having the same composition as the ceramic green sheets 60A, 60B, an organic binder, and an organic solvent. When the assembly is subsequently baked into the ceramic base 16, as shown in FIG. 11B, the protrusions 72 become part of the movable portions 22a, 22b, and the ceramic green sheets 60A, 60B become the thin plates 12a, 12b. At this time, the bonding strength between the thin plates 12a, 12b and the protrusions 72 is increased.

The paste may comprise a paste including the ceramic material, a metal material, an organic binder, and an organic solvent. The metal material should preferably be a platinum-group metal which is highly resistant to heat because the protrusions 72 are exposed to high temperatures when the assembly is baked into the ceramic base 16, and most preferably be platinum.

The porosity of the protrusions 72 that are formed should preferably be 50% or less, or more preferably be 30% or less. If the porosity exceeds 50%, then it tends to be difficult to keep the protrusions 72 and hence the movable portions 22a, 22b in a constant shape, resulting in a tendency to reduce the strength of the movable portions 22a, 22b.

If the protrusions 72 is formed of a paste comprising a material different from the ceramic green sheets 60A, 60B, an organic binder, and an organic solvent, according to the screen printing process, then the porosity of the protrusions 72 should preferably be in the range from 5 to 30% because stresses generated based on the difference between the coefficients of thermal expansion of the ceramic green sheets 60A, 60B can be reduced.

Figure 12A:
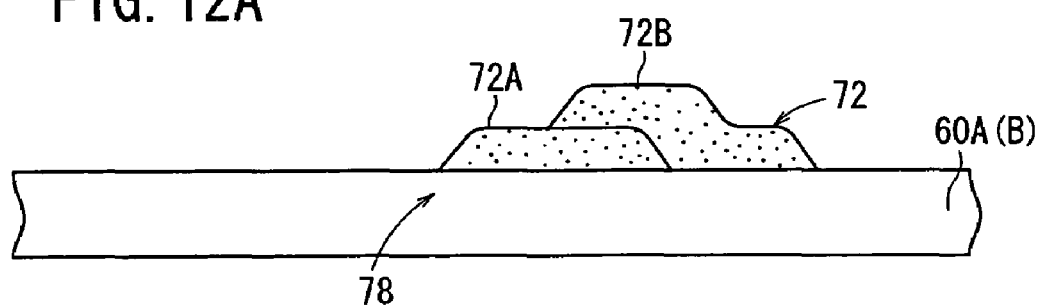
FIG. 12A is a view showing a state wherein a protrusion is formed by printing a paste on a principal surface of a ceramic green sheet by a manufacturing method according to a second specific example.

A manufacturing method according to a second specific example will be described below with reference to FIGS. 12A and 12B. The manufacturing method according to the second specific example includes substantially the same steps as those of the manufacturing method according to the first specific example, but differs therefrom in that when the protrusions 72 are formed in step S5 shown in FIG. 2, as shown in FIG. 12A, a first protrusion 72A is formed of a paste on the principal surface of the ceramic green sheet 60A according to the screen printing process, and thereafter a second protrusion 72B is formed of a paste on the first protrusion 72A according to the screen printing process in such a displaced position that the second protrusion 72B has a portion overlapping the first protrusion 72A.

With this arrangement, the thickness of the protrusions 72 can be increased, and the gradient of the portions of the protrusions 72 (the first protrusion 72A and the second protrusion 72B) which are held in contact with the ceramic green sheets 60A, 60B can be reduced. If the thickness of the protrusions 72 is increased, when the movable portions 22a, 22b are subsequently fabricated, stresses tend to concentrate on boundaries 78 between the protrusions 72 and the thin plates 12a, 12b.

Figure 12B:
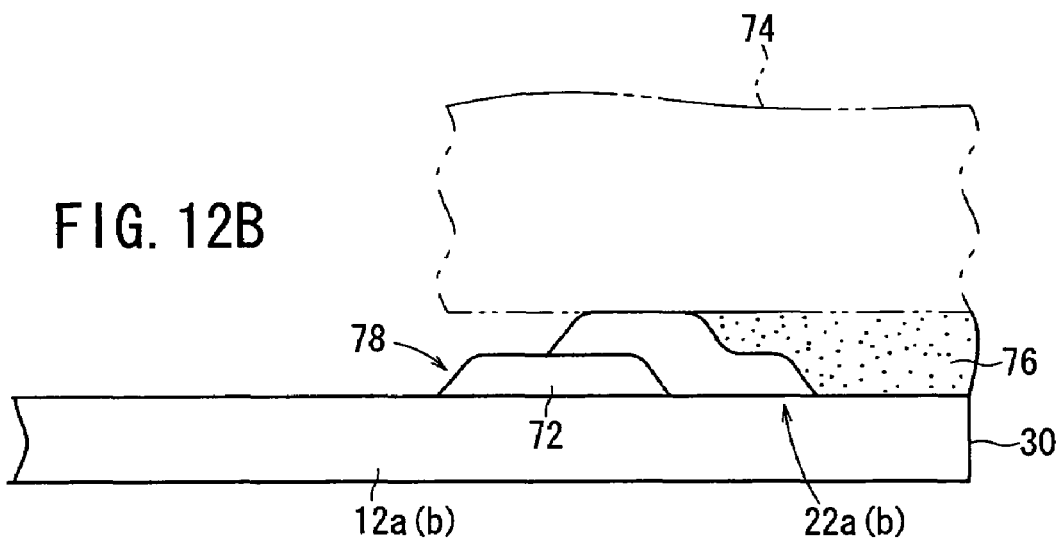
FIG. 12B is a view showing a state wherein a component is mounted on a movable portion after a piezoelectric/electrostrictive device is formed.

However, as shown in FIG. 12B, since the gradient of the boundaries 78 between the protrusions 72 and the thin plates 22a, 22b is small and the boundaries 78 have an obtuse angle, stresses on the boundaries 78 can be distributed, and any stresses concentrating on one region are reduced. The reduced stresses are highly advantageous for increasing the shock resistance of the piezoelectric/electrostrictive device 10.

Figure 13A:
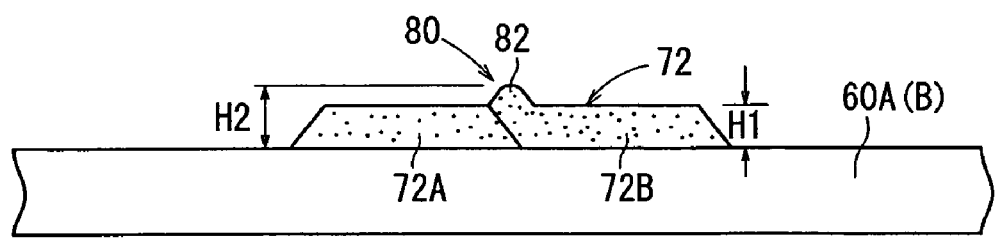
FIG. 13A is a view showing a state wherein a protrusion is formed by printing a paste on a principal surface of a ceramic green sheet by a manufacturing method according to a third specific example.

A manufacturing method according to a third specific example includes substantially the same steps as those of the manufacturing method according to the second specific example, but differs therefrom in that when the protrusions 72 are formed in step S5 shown in FIG. 2, as shown in FIG. 13A, a first protrusion 72A and a second protrusion 72B overlap each other in a smaller range.

Specifically, if the first protrusion 72A or the second protrusion 72B has a thickness H1 and a thickest portion 82 of an overlapping region 80 of the first protrusion 72A and the second protrusion 72B has a thickness H2, then these thicknesses have a ratio H1/H2=1/3 to 3/4.

Figure 13B:
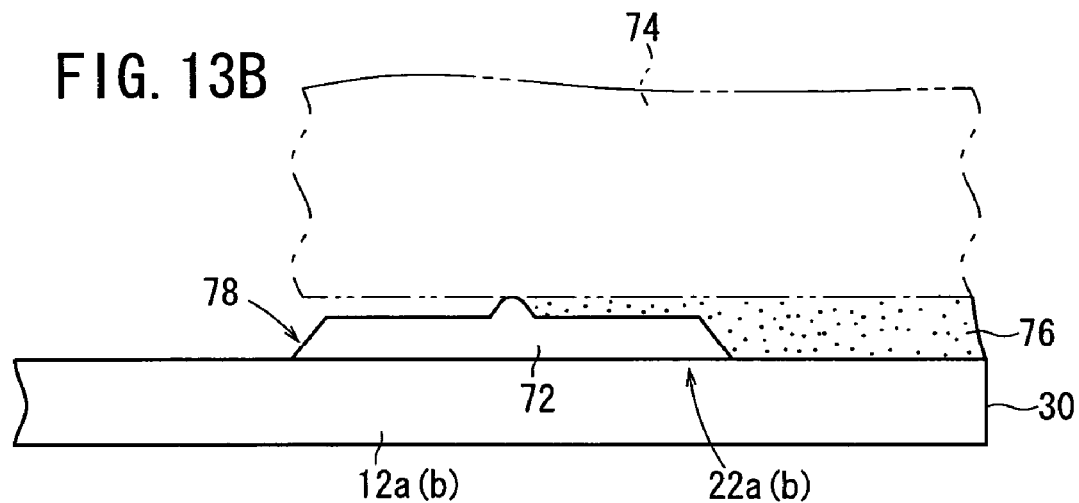
FIG. 13B is a view showing a state wherein a component is mounted on a movable portion after a piezoelectric/electrostrictive device is formed.

With this arrangement, the thickness of the entire protrusion 72 can be reduced. As shown in FIG. 13B, when the movable portions 22a, 22b are subsequently fabricated, stresses on the boundaries 78 between the protrusions 72 and the thin plates 12a, 12b can be reduced.

Figure 14A:
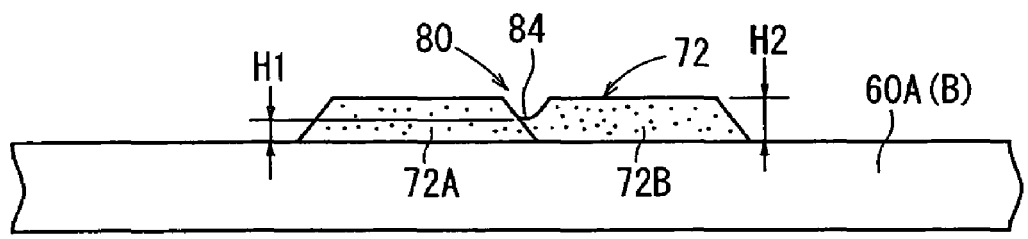
FIG. 14A is a view showing a state wherein a protrusion is formed by printing a paste on a principal surface of a ceramic green sheet by a manufacturing method according to a fourth specific example.

A manufacturing method according to a fourth specific example includes substantially the same steps as those of the manufacturing method according to the third specific example, but differs therefrom in that when the protrusions 72 are formed in step S5 shown in FIG. 2, as shown in FIG. 14A, a first protrusion 72A and a second protrusion 72B overlap each other in an even smaller range, and if an overlapping region 80 of the first protrusion 72A and the second protrusion 72B has a thickness H1 and a thickest portion of the first protrusion 72A or the second protrusion 72B has a thickness H2, then these thicknesses have a ratio H1/H2=1/3 to 3/4.

Figure 14B:
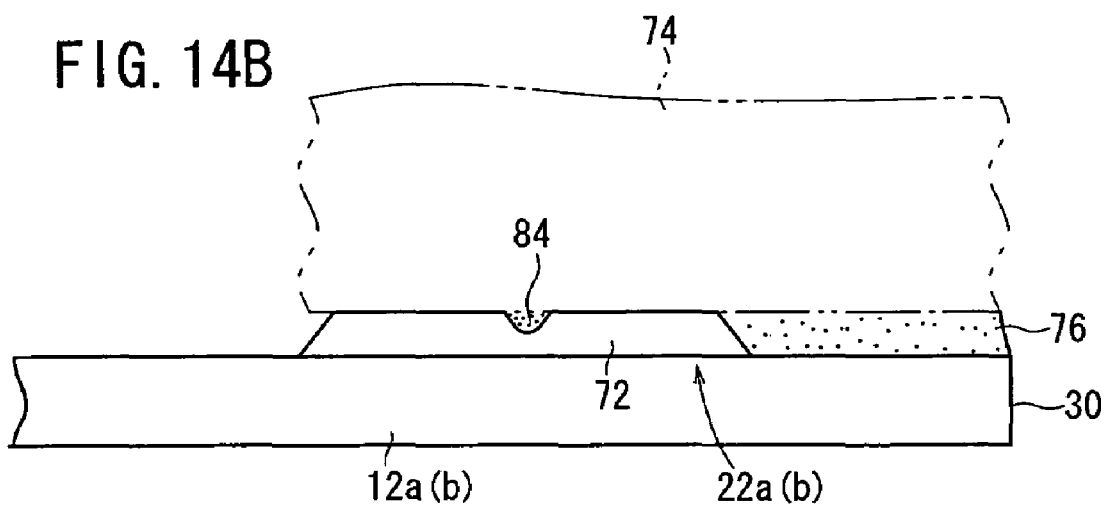
FIG. 14B is a view showing a state wherein a component is mounted on a movable portion after a piezoelectric/electrostrictive device is formed.

With this arrangement, a recess 84 is defined in the overlapping region 80 of the first protrusion 72A and the second protrusion 72B. As shown in FIG. 14B, when the movable portions 22a, 22b are subsequently fabricated and an article 74 is attached, the adhesive 76 can reliably be retained in the recess 84.

A manufacturing method according to a fifth specific example includes substantially the same steps as those of the manufacturing method according to the first specific example, but differs therefrom in that when the protrusions 72 are formed in step S5 shown in FIG. 2, the protrusions 72 are formed of a paste having a viscosity higher than the viscosity of the paste used in the manufacturing method according to the first specific example (see FIG. 11A), i.e., the viscosity A in the order of 10,000 cps of the paste where the thickness H of the formed protrusion 72 is substantially uniform.

FIG. 16 is a table showing how the thickness and shape of the protrusions 72 change depending on the viscosity, etc. of the paste. The printing speed was 200 mm/sec., the breakaway was 1.5 mm, a flat squeezee was used, and an E-type viscometer (3° cone, 0.5 rpm) manufactured by Tokyo Keiki was used as a viscosity measuring instrument.

Figure 15A:
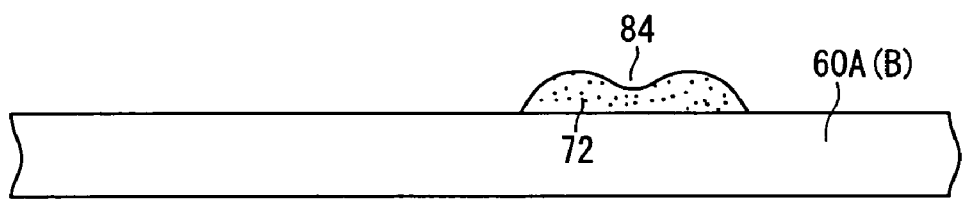
FIG. 15A is a view showing a state wherein a protrusion is formed by printing a paste on a principal surface of a ceramic green sheet by a manufacturing method according to a fifth specific example.
Figure 15B:
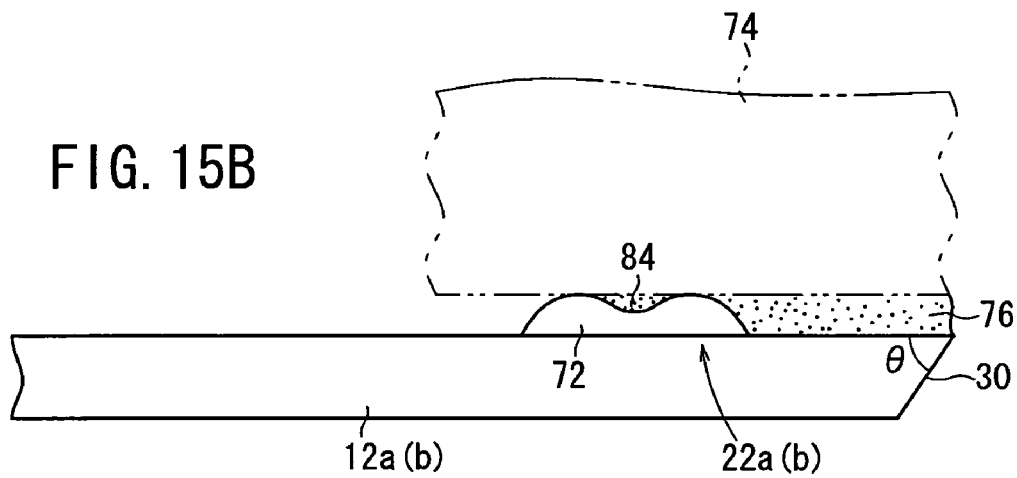
FIG. 15B is a view showing a state wherein a component is mounted on a movable portion after a piezoelectric/electrostrictive device is formed.

As can be seen from the table of FIG. 16, if the viscosity of the paste was higher than the viscosity of the paste used in the first specific example (see FIG. 11A), e.g., twice the viscosity of the paste used in the first specific example, then when the protrusion 72 was formed by a single screen printing process as shown in FIG. 15A, a recess 84 could be defined centrally in the protrusion 72, thus providing the same advantages as those of the protrusions 72 produced by the manufacturing method according to the fourth specific example. Specifically, as shown in FIG. 15B, when the movable portions 22a, 22b are subsequently fabricated and an article 74 is attached, the adhesive 76 can reliably be retained in the recess 84. In the example shown in FIG. 15B, the tip end faces 30 of the thin plates 12a, 12b are tapered at an acute inclined angle θ with respect to the inner wall surfaces of the thin plates 12a, 12b.

Figure 17A:
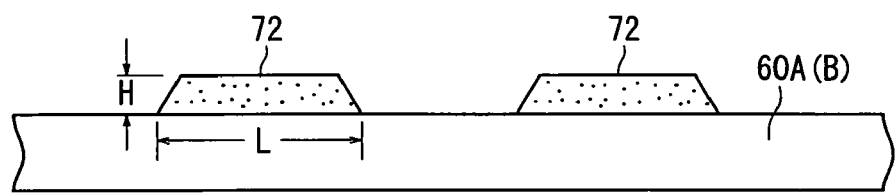
FIG. 17A is a view showing a state wherein a protrusion is formed by printing a paste on a principal surface of a ceramic green sheet by a manufacturing method according to a sixth specific example.

A manufacturing method according to a sixth specific example includes substantially the same steps as those of the manufacturing method according to the first specific example, but differs therefrom in that when the protrusions 72 are formed in step S5 shown in FIG. 2, as shown in FIG. 17A, a plurality of protrusions 72 are formed separately from each other on a principal surface of each of the ceramic green sheets 60A, 60B. Each of the protrusions 72 has a width L of 30 μm or greater and a thickness H in the range from 2 to 50 μm.

Figure 17B:
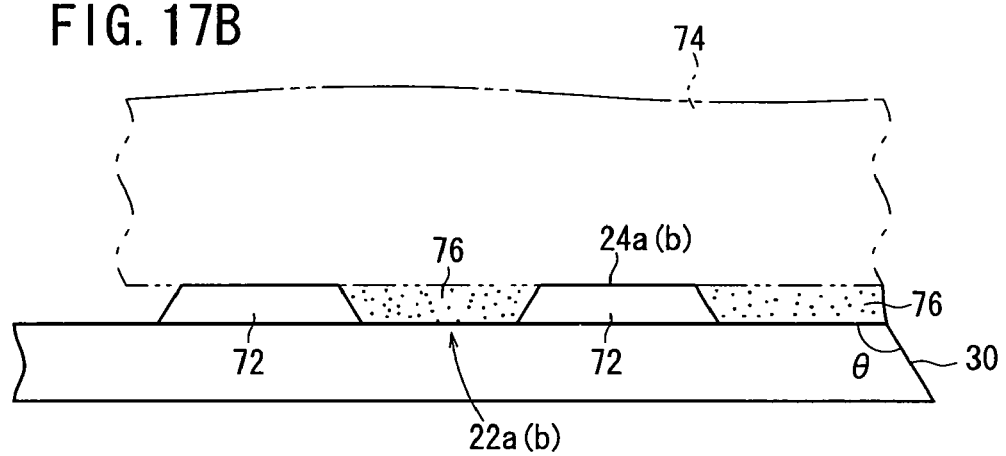
FIG. 17B is a view showing a state wherein a component is mounted on a movable portion after a piezoelectric/electrostrictive device is formed.
Figure 18:
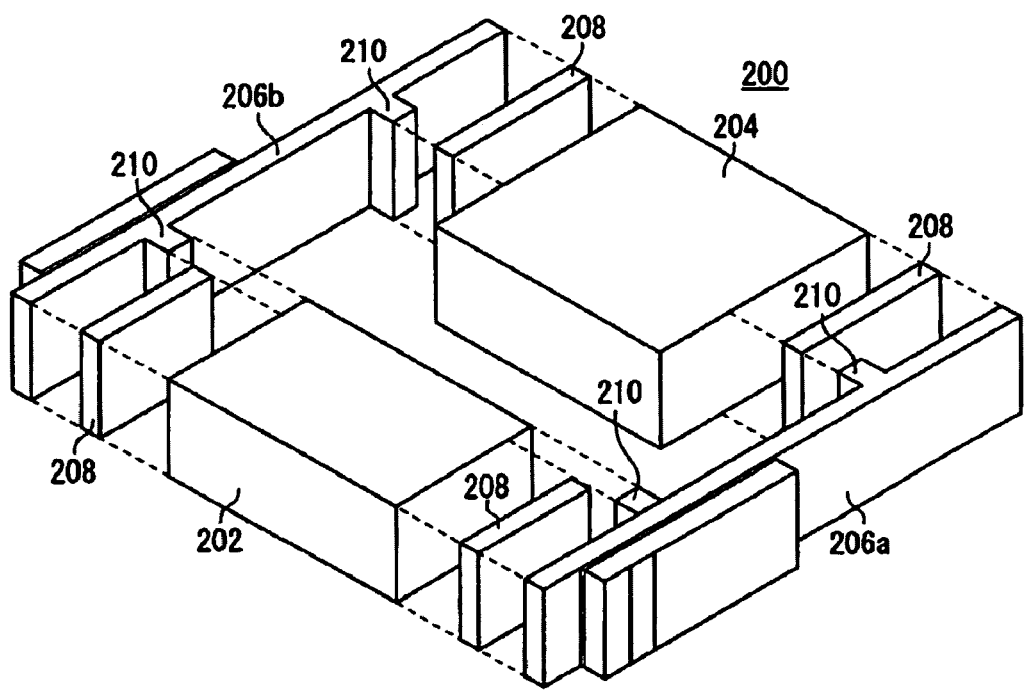
FIG. 18 is an exploded perspective view of a proposed piezoelectric/electrostrictive device.

As shown in FIG. 17B, since a plurality of movable portions 22a (or 22b) are disposed in spaced relation to each other on one thin plate 12a (or 12b), the ability to determine an amount (thickness) and a position (bonding area) of the adhesive 76 can further be increased. In the example shown in FIG. 17B, the tip end faces 30 of the thin plates 12a, 12b are tapered at an obtuse inclined angle θ with respect to the inner wall surfaces of the thin plates 12a, 12b.

The piezoelectric/electrostrictive device 10 produced by the manufacturing method according to the first through sixth specific examples can be used as active devices including various transducers, various actuators, frequency-domain functional components (filters), transformers, and vibrators, resonators, oscillators, and discriminators for communications or power applications, and also as sensors including an ultrasonic sensor, an acceleration sensor, an angular velocity sensor, an impact sensor, a mass sensor, etc. Particularly, the piezoelectric/electrostrictive device 10 can be used as various actuators for use as mechanisms for displacing, positioning, and angularly adjusting various precision components of optical and precision devices.

In the above manufacturing process, the protrusions 72 are formed on the principal surfaces of the ceramic green sheets 60A, 60B by the screen printing process. However, other processes including electrophoresis, brush coating, transferring, dipping, etc. may be used.

The method of manufacturing a piezoelectric/electrostrictive device according to the present invention is not limited to the above embodiment, but may take various arrangements without departing from the scope of the invention.

INDUSTRIAL APPLICABILITY

There can be fabricated a high-performance piezoelectric/electrostrictive device having protrusions whose shape does not tend to affect the mechanical characteristics of thin plates by optimizing a process of forming the protrusions and the shape of the protrusions when the thin plates are made of ceramics.

What is claimed is:

1. A method of manufacturing a piezoelectric/electrostrictive device including a pair of thin plates confronting each other, a fixing member supporting the thin plates thereon, and movable portions disposed on end portions of the pair of thin plates, comprising the steps of:

forming protrusions which will subsequently serve as the movable portions on principal surfaces of first ceramic green sheets which will subsequently serve as the thin plates, according to at least a single thick film forming process;

stacking said first ceramic green sheets and a second ceramic green sheet which will subsequently serve as the fixing member, into a ceramic green laminated body;

baking said ceramic green laminated body into an integral ceramic laminated body; and forming piezoelectric/electrostrictive elements on said ceramic laminated body, baking said piezoelectric/electrostrictive elements and removing unnecessary portions therefrom to fabricate the piezoelectric/electrostrictive device.

2. A method of manufacturing a piezoelectric/electrostrictive device according to claim 1, wherein said protrusions have a width of 30 $\mu$m or greater.

3. A method of manufacturing a piezoelectric/electrostrictive device according to claim 1, wherein said protrusions have a thickness in the range from 2 to 50 $\mu$m.

4. A method of manufacturing a piezoelectric/electrostrictive device according to claim 1, wherein said protrusions include a peripheral portion having a thickness H1 and a central thickest portion having a thickness H2, and the thicknesses have a ratio as follows:

$$H1/H2=1/3 \text{ to } 3/4.$$

5. A method of manufacturing a piezoelectric/electrostrictive device according to claim 1, wherein said protrusions include a central portion having a thickness H1 and a peripheral thickest portion having a thickness H2, and the thicknesses have a ratio as follows:

$$H1/H2=1/3 \text{ to } 3/4.$$

6. A method of manufacturing a piezoelectric/electrostrictive device according to claim 5, wherein a material for the protrusions for making the thickness of said protrusions substantially uniform has a viscosity, or greater, A in an order of 10,000 cps, higher than said viscosity A.

7. A method of manufacturing a piezoelectric/electrostrictive device according to claim 1, wherein when said protrusions are formed on said first ceramic green sheets, a first protrusion is formed on said first ceramic green sheets, and thereafter a second protrusion is formed on said first protrusion in such a displaced position that the second protrusion partly overlaps said first protrusion.

8. A method of manufacturing a piezoelectric/electrostrictive device according to claim 7, wherein said first protrusion or said second protrusion has a thickness H1, a thickest portion of an overlapping region of the first protrusion and the second protrusion has a thickness H2, and the thicknesses have a ratio as follows:

$$H1/H2=1/3 \text{ to } 3/4.$$

9. A method of manufacturing a piezoelectric/electrostrictive device according to claim 7, wherein an overlapping region of the first protrusion and the second protrusion has a thickness H1, a thickest portion of said first protrusion or said second protrusion has a thickness H2, and the thicknesses have a ratio as follows:

$$H1/H2=1/3 \text{ to } 3/4.$$

10. A method of manufacturing a piezoelectric/electrostrictive device according to claim 1, wherein when said protrusions are formed on said first ceramic green sheets, a plurality of protrusions are formed separately from each other on said first ceramic green sheets.

11. A method of manufacturing a piezoelectric/electrostrictive device according to claim 1, wherein said protrusions are formed of a paste comprising a ceramic material which has the same composition as said first ceramic green sheets, an organic binder, and an organic solvent according to a screen printing process.

12. A method of manufacturing a piezoelectric/electrostrictive device according to claim 1, wherein a paste comprising a ceramic material, a metal material, an organic binder, and an organic solvent is used.

13. A method of manufacturing a piezoelectric/electrostrictive device according to claim 12, wherein said metal material comprises a platinum group metal.

14. A method of manufacturing a piezoelectric/electrostrictive device according to claim 1, wherein when said protrusions are formed of a paste comprising a ceramic material which has the same composition as said first ceramic green sheets, an organic binder, and an organic solvent according to a screen printing process, said protrusions have a porosity of 50% or less.

15. A method of manufacturing a piezoelectric/electrostrictive device according to claim 1, wherein when said protrusions are formed of a paste comprising a ceramic material which is different from said first ceramic green sheets, an organic binder, and an organic solvent according to a screen printing process, said protrusions have a porosity in the range from 5 to 30%.

* * * * *

UNITED STATES PATENT AND TRADEMARK OFFICE
CERTIFICATE OF CORRECTION

PATENT NO. : 7,007,355 B2
APPLICATION NO. : 10/784732
DATED : March 7, 2006
INVENTOR(S) : Koji Ikeda et al.

It is certified that error appears in the above-identified patent and that said Letters Patent is hereby corrected as shown below:

Column 17

*Line 48:* please add --A-- after "viscosity" and delete "A" before "in"

*Line 49:* please delete ", higher than said viscosity A"

Column 18

*Line 36:* please add -- - -- between "platinum group"

Signed and Sealed this

First Day of May, 2007

JON W. DUDAS
*Director of the United States Patent and Trademark Office*